United States Patent
Iida et al.

(10) Patent No.: US 8,241,424 B2
(45) Date of Patent: Aug. 14, 2012

(54) SINGLE CRYSTAL SEMICONDUCTOR MANUFACTURING APPARATUS AND MANUFACTURING METHOD

(75) Inventors: Tetsuhiro Iida, Hiratsuka (JP); Yutaka Shiraishi, Hiratsuka (JP); Junsuke Tomioka, Hiratsuka (JP)

(73) Assignee: Sumco Techxiv Kabushiki Kaisha, Kanagawa (JP)

( * ) Notice: Subject to any disclaimer, the term of this patent is extended or adjusted under 35 U.S.C. 154(b) by 1172 days.

(21) Appl. No.: 11/992,510

(22) PCT Filed: Sep. 25, 2006

(86) PCT No.: PCT/JP2006/318960
§ 371 (c)(1),
(2), (4) Date: Mar. 24, 2008

(87) PCT Pub. No.: WO03/029533
PCT Pub. Date: Apr. 10, 2003

(65) Prior Publication Data
US 2009/0133617 A1    May 28, 2009

(30) Foreign Application Priority Data
Sep. 30, 2005 (JP) .................................. 2005-287356

(51) Int. Cl.
*C30B 21/04* (2006.01)
(52) U.S. Cl. .............. 117/213; 117/13; 117/18; 117/23; 117/25; 117/217
(58) Field of Classification Search .................. 117/217, 117/213, 13, 18, 23, 25
See application file for complete search history.

(56) References Cited

U.S. PATENT DOCUMENTS

| 5,363,796 | A | 11/1994 | Kobayashi et al. |
| 5,766,347 | A | 6/1998 | Shimomura et al. |
| 5,968,266 | A | 10/1999 | Lino et al. |
| 6,285,011 | B1 | 9/2001 | Cherko |
| 6,355,910 | B1 | 3/2002 | Seidl et al. |
| 6,562,134 | B1 | 5/2003 | Maeda et al. |

FOREIGN PATENT DOCUMENTS

JP    60-046998    3/1985
(Continued)

OTHER PUBLICATIONS

International Search Report regarding PCT/JP2006/318960.

*Primary Examiner* — Bob M Kunemund
(74) *Attorney, Agent, or Firm* — Husch Blackwell LLP (57) ABSTRACT

An upper side heater 10 is configured so that a current passage width becomes larger at a heater lower part than at a heater upper part. Thus, the upper side heater 10 has a current-carrying cross-sectional area which becomes larger at the heater lower part than at the heater upper part, a resistance value becomes accordingly smaller at the heater lower part than at the heater upper part, and a heat generation amount becomes relatively smaller at the heater lower part than at the heater upper part. Meanwhile, a lower side heater 20 is configured so that the current passage width becomes larger at the heater upper part than at the heater lower part. Thus, the current-carrying cross-sectional area of the lower side heater 20 becomes larger at the heater upper part than at the heater lower part, a resistance value becomes accordingly smaller at the heater upper part than at the heater lower part, and a heat generation amount becomes relatively smaller at the heater upper part than at the heater lower part.

6 Claims, 7 Drawing Sheets

| 3 QUARTZ CRUCIBLE | 6 SINGLE CRYSTAL SILICON | 11 HEATER-SIDE POSITIVE ELECTRODE |
| 4 PULL-UP MECHANISM | 7 GRAPHITE CRUCIBLE | 12 HEATER-SIDE GROUND ELECTRODE |
| 4a PULL-UP SHAFT | 8a HEAT SHIELDING PLATE | 20 LOWER-SIDE HEATER |
| 4b SEED CRYSTAL | 8b HEAT-RETAINING TUBE | 21 HEATER-SIDE POSITIVE ELECTRODE |
| 5 MELT | 9 ROTATION SHAFT | 22 HEATER-SIDE NEGATIVE ELECTRODE |
| 5a MELT SURFACE | 10 UPPER SIDE HEATER | 49 SHAFT HOLE |

FOREIGN PATENT DOCUMENTS

| | | |
|---|---|---|
| JP | 62-153191 | 7/1987 |
| JP | 02-217388 | 8/1990 |
| JP | 09-263484 | 7/1997 |
| JP | 10-101482 | 4/1998 |
| JP | 01-39792 | 2/2001 |
| JP | 04-217503 | 8/2004 |

FIG.1(a)

| | | |
|---|---|---|
| 3 QUARTZ CRUCIBLE | 6 SINGLE CRYSTAL SILICON | 11 HEATER-SIDE POSITIVE ELECTRODE |
| 4 PULL-UP MECHANISM | 7 GRAPHITE CRUCIBLE | 12 HEATER-SIDE GROUND ELECTRODE |
| 4a PULL-UP SHAFT | 8a HEAT SHIELDING PLATE | 20 LOWER-SIDE HEATER |
| 4b SEED CRYSTAL | 8b HEAT-RETAINING TUBE | 21 HEATER-SIDE POSITIVE ELECTRODE |
| 5 MELT | 9 ROTATION SHAFT | 22 HEATER-SIDE NEGATIVE ELECTRODE |
| 5a MELT SURFACE | 10 UPPER SIDE HEATER | 49 SHAFT HOLE |

- 3 QUARTZ CRUCIBLE
- 4 PULL-UP MECHANISM
- 4a PULL-UP SHAFT
- 4b SEED CRYSTAL
- 5 MELT
- 5a MELT SURFACE
- 6 SINGLE CRYSTAL SILICON
- 7 GRAPHITE CRUCIBLE
- 8a HEAT SHIELDING PLATE
- 8b HEAT-RETAINING TUBE
- 9 ROTATION SHAFT
- 10 HEATER
- 11 HEATER-SIDE POSITIVE ELECTRODE
- 12 HEATER-SIDE GROUND ELECTRODE

SINGLE CRYSTAL SEMICONDUCTOR MANUFACTURING APPARATUS AND MANUFACTURING METHOD

TECHNICAL FIELD

The present invention relates to an apparatus for manufacturing a single crystal semiconductor and a manufacturing method.

BACKGROUND ART

Figure 3:
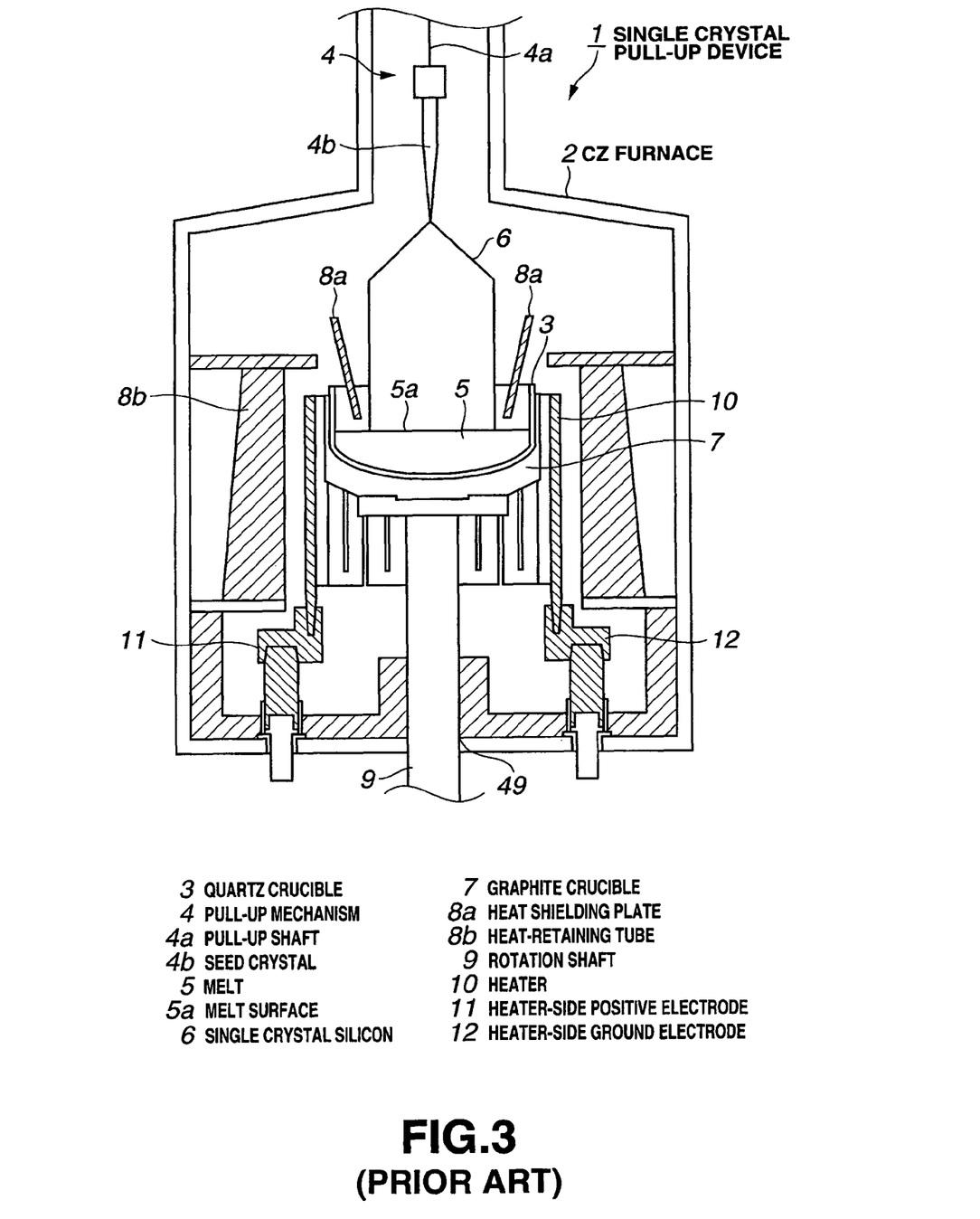
FIG. 3 is a sectional side view showing a structure of a single crystal semiconductor manufacturing apparatus in which a conventional heater is incorporated.

FIG. 3 shows an example of a structure of a conventional single crystal pull-up device 1.

A quartz crucible 3 is disposed in a single crystal pulling vessel 2, namely a CZ furnace 2. Polycrystalline silicon (Si) is heated and melted in the quartz crucible 3. After the melting is stabilized, a single crystal silicon 6 is pulled up from a silicon melt 5 in the quartz crucible 3 by a pull-up mechanism 4 by a CZ method. When pulling up, the quartz crucible 3 is rotated by a rotation shaft 9.

During a single crystal pull-up process (single batch), various types of vaporized materials are generated in the vessel 2. Accordingly, argon (Ar) gas is supplied into the single crystal pulling vessel 2 and exhausted together with the vaporized materials out of the vessel 2 to remove the vaporized materials from the vessel 2, thereby cleaning it. A supply flow rate of the argon gas is determined for each process of the single batch.

A heat shielding plate 8a (gas rectifying tube) is provided above the quartz crucible 3 and also around the single crystal silicon 6 to rectify the gas in the single crystal pulling vessel 2 so as to guide it to a surface 5a of the melt 5 and to shield the single crystal silicon 6 from a heat source. A distance of the gap between the bottom end of the heat shielding plate 8a and the melt surface 5a is determined appropriately.

Oxygen is in a state of non-solid solution in the pulled-up and grown single crystal silicon 6. The oxygen dissolves from the quartz crucible 3 into the silicon melt 5 and is taken into the single crystal silicon 6 when it is pulled up. The oxygen concentration in the single crystal silicon 6 has a significant influence on the element and device characteristics and also has significant influence on the yield in the element and device manufacturing process. The element and device have various oxygen concentrations which are required depending on their types. Therefore, the manufacturing of single crystal silicon requires a process capable of coping with various oxygen concentrations. At the same time, when the oxygen concentration is more uniform in a growing direction of the crystal, the portion conforming to the oxygen concentration required for the element and device become larger. Therefore, when the control range of the oxygen concentration is increased for the entire crystal, it becomes possible to improve the yield of the single crystal silicon.

A single heater 10 is disposed in a ring shape around the quartz crucible 3. The heater 10 has a positive electrode 11 and a negative (ground) electrode 12 and generates heat when a voltage is applied between the electrodes to heat the melt 5 in the quartz crucible 3. The electric power supplied to the heater 10 is adjusted to change a heat generation amount of the heater 10, so that the temperature of the quartz crucible 3 is changed to change a behavior of oxygen, which is eluted from the quartz crucible 3 and taken into the single crystal silicon 6. Thus, the heat generation amount of the heater 10 has an influence on the oxygen concentration in the single crystal silicon 6.

But, when the single heater 10 shown in FIG. 3 is used, the distribution of the heat generation amount in the vertical direction of the heater 10, namely the temperature distribution of the quartz crucible 3, cannot be changed largely. Therefore, mere adjustment of the electric power supplied to the single heater 10 is virtually hard to provide a uniform oxygen concentration in the growing direction of the single crystal silicon 6 because the control width of the oxygen concentration in the single crystal silicon 6 is very small.

Accordingly, there are conventionally known inventions that provide a plurality of heaters vertically at individual positions around the quartz crucible 3 to increase even somewhat the control width of the oxygen concentration in the single crystal silicon 6 as described in the following Patent Literatures.

Patent Literature 1 discloses a heater apparatus that a heater is vertically disposed at two stages along a side surface of a quartz crucible.

Patent Literature 2 discloses a heater apparatus that a heater is disposed at a side surface and a bottom of a quartz crucible.

Patent Literature 3 discloses an invention that a heater is vertically disposed at two stages along a side surface of a quartz crucible and a ratio of electric power supplied to the individual heaters is limited to a prescribed range to control an oxygen concentration in the single crystal silicon.

Patent Literature 4 discloses an invention that a heater is vertically disposed at three stages along a side surface of a quartz crucible, the individual heaters are determined to have a different electric resistance, electric power is supplied from a common power source to the individual heaters, and heat generation amounts generated by the individual heaters are made different to control the oxygen concentration in the single crystal silicon.

Patent Literature 1: JP-A 62-153191
Patent Literature 2: Japanese Patent No. 2681115
Patent Literature 3: Japanese Patent No. 3000923
Patent Literature 4: JP-A 2001-39792

And, the methods described below, that control the oxygen concentration by means other than the heater, have been put into practice and known.

1) Method that controls the oxygen concentration in the single crystal silicon by a crucible rotation speed, a pressure in the furnace and a gas flow rate in the furnace.

2) Method that controls the oxygen concentration in the single crystal silicon by providing a magnetic field generation device and applying a magnetic field to the melt in the quartz crucible by the magnetic field generation device.

SUMMARY OF THE INVENTION

Problems to be Solved by the Invention

According to the above method 1), the control width of the oxygen concentration in the single crystal silicon is narrow, and the yield of the single crystal silicon is low.

According to the above method 2), the cost for introduction of the magnetic field generation device and the cost for its maintenance and management are very high, so that it is hard to manufacture semiconductor products at a low cost.

Meanwhile, the method of controlling the oxygen concentration in the single crystal silicon by the plural heaters can make the control width of the oxygen concentration in the single crystal silicon somewhat larger than the above method 1) and can improve the yield of the single crystal silicon though only slightly. And, the cost does not become as high as that for the above method 2).

The method of controlling the oxygen concentration in the single crystal silicon by the plural heaters adjusts the ratio of electric power supplied to the plural heaters to change actively the temperature distribution in the vertical direction of the quartz crucible. Thus, a dissolving rate of the quartz crucible as an oxygen source is changed, or the convection of the melt for transporting the dissolved oxygen to the single crystal silicon is changed. As a result, the temperature distribution in the growing direction of the single crystal silicon is changed, and the oxygen concentration in the single crystal silicon can be changed.

The method described in Patent Literature 3 is a method that limits a ratio of electric power supplied to the individual heaters to a prescribed range. And, a change range of the temperature distribution in the growing direction of the single crystal silicon is naturally defined by the electric power ratio in its prescribed range, so that the temperature distribution cannot be changed largely. Therefore, the control width of the oxygen concentration in the single crystal silicon is not large enough, and the yield of the semiconductor products is not satisfactory.

The method described in Patent Literature 4 causes each heater to have a different resistance value and a different heat generation amount, and a range of temperature distribution in the growing direction of the single crystal silicon is defined by the height of each heater and the quantity of the heaters, and the temperature distribution cannot be changed largely. Therefore, the control width of the oxygen concentration in the single crystal silicon is not large enough, and the yield of the semiconductor products is not satisfactory.

The present invention has been made in view of the above circumstances and improves the yield of semiconductor products by enabling to change the temperature distribution of the quartz crucible when the oxygen concentration of the single crystal silicon is controlled by plural heaters and increasing the control width of the oxygen concentration in the single crystal silicon to be larger than before.

Means for Solving the Problems

A first invention is a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, wherein:
 the heaters are a plurality of heaters disposed at respective positions in a vertical direction of the crucible;
 the individual heaters are separately supplied with electric power and configured of a conductor which generates heat when electric power is applied; and
 the heater positioned at an upper part has a resistance value at respective parts of the heater adjusted to have relatively a smaller heat generation amount at a heater lower part than at a heater upper part.

A second invention is a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, wherein:
 the heaters are a plurality of heaters disposed at respective positions in a vertical direction of the crucible;
 the individual heaters are separately supplied with electric power and configured of a conductor which generates heat when electric power is applied; and
 the heater positioned at a lower part has a resistance value at respective parts of the heater adjusted to have relatively a smaller heat generation amount at a heater upper part than at a heater lower part.

A third invention is a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, wherein:
 the heaters are a plurality of heaters disposed at respective positions in a vertical direction of the crucible;
 the individual heaters are separately supplied with electric power and configured of a conductor which generates heat when electric power is applied;
 the heater positioned at an upper part has a resistance value at respective parts of the heater adjusted to have relatively a smaller heat generation amount at a heater lower part than at a heater upper part; and
 the heater positioned at a lower part has a resistance value at respective parts of the heater adjusted to have relatively a smaller heat generation amount at a heater upper part than at a heater lower part.

A fourth invention is the single crystal semiconductor manufacturing apparatus according to the first invention, the second invention and the third invention, wherein the heaters have a different current-carrying cross-sectional area between the heater upper part and the heater lower part.

A fifth invention is the single crystal semiconductor manufacturing apparatus according to the fourth invention, wherein the current-carrying cross-sectional areas of the heaters are adjusted depending on a current passage width or a current passage thickness.

Aسixth invention is the single crystal semiconductor manufacturing apparatus according to the first invention, the second invention, the third invention, the fourth invention and the fifth invention, wherein the plurality of heaters are two heaters which are disposed at respective positions in a vertical direction of the crucible; the upper heater is formed to enter its current passage partly into a position lower than the position corresponding to the upper end position of the lower heater; and the lower heater is formed to enter its current passage partly into a position higher than the position corresponding to the lower end position of the upper heater.

A seventh invention is a single crystal semiconductor manufacturing method using a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, wherein:
 the heaters are a plurality of heaters disposed at respective positions in a vertical direction of the crucible;
 the individual heaters are separately supplied with electric power and configured of a conductor which generates heat when electric power is applied; and
 the heater positioned at an upper part has a resistance value at respective parts of the heater adjusted to have relatively a smaller heat generation amount at a heater lower part than at a heater upper part to manufacture a single crystal semiconductor.

An eighth invention is a single crystal semiconductor manufacturing method using a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, wherein:

the heaters are a plurality of heaters disposed at respective positions in a vertical direction of the crucible;

the individual heaters are separately supplied with electric power and configured of a conductor which generates heat when electric power is applied; and the heater positioned at a lower part has a resistance value at respective parts of the heater adjusted to have relatively a smaller heat generation amount at a heater upper part than at a heater lower part to manufacture a single crystal semiconductor.

A ninth invention is a single crystal semiconductor manufacturing method using a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, wherein:

the heaters are a plurality of heaters disposed at respective positions in a vertical direction of the crucible;

the individual heaters are separately supplied with electric power and configured of a conductor which generates heat when electric power is applied;

the heater positioned at an upper part has a resistance value at respective parts of the heater adjusted to have relatively a smaller heat generation amount at a heater lower part than at a heater upper part; and the heater positioned at a lower part has a resistance value at respective parts of the heater adjusted to have relatively a smaller heat generation amount at a heater upper part than at a heater lower part to manufacture a single crystal semiconductor.

A tenth invention is the single crystal semiconductor manufacturing method according to the seventh invention, the eighth invention and the ninth invention, wherein the heater has a different current-carrying cross-sectional area between the heater upper part and the heater lower part.

An eleventh invention is the single crystal semiconductor manufacturing method according to the tenth invention, wherein the current-carrying cross-sectional area of the heater is adjusted depending on a current passage width or a current passage thickness.

A twelfth invention is the single crystal semiconductor manufacturing method according to the seventh invention, the eighth invention, the ninth invention, the tenth invention and the eleventh invention, wherein the plurality of heaters are two heaters which are disposed at respective positions in a vertical direction of the crucible; the upper heater is formed to enter its current passage partly into a position lower than the position corresponding to the upper end position of the lower heater; and the lower heater is formed to enter its current passage partly into a position higher than the position corresponding to the lower end position of the upper heater.

The oxygen in the single crystal is the oxygen which is eluted from the quartz crucible into a silicon melt and taken into the crystal, but it is generally known that it depends mainly on the eluted amount from the bottom inner surface of the quartz crucible. Namely, the eluted amount increases as the temperature of the quartz crucible bottom becomes higher, and the oxygen concentration which is taken into the single crystal becomes high, and when the temperature lowers, the oxygen concentration which is taken into the single crystal becomes low.

Figure 2:
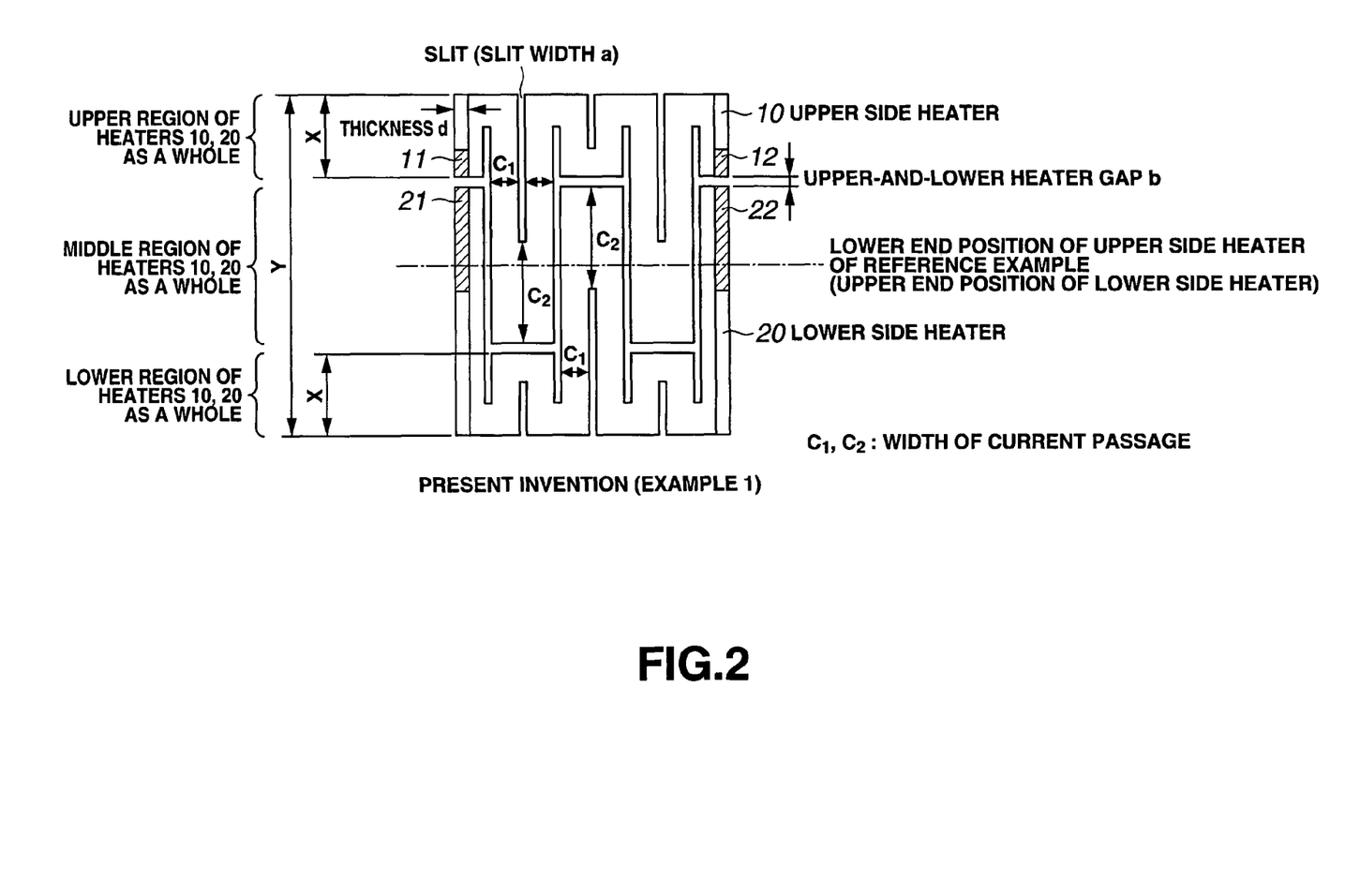
FIG. 2 is a sectional view showing a structure of a heater of Example 1.

The present invention is described with reference to the drawings. As shown in FIG. 2, the upper side heater 10 is configured so that the width of the current passage is determined to have width c2 of a heater lower part larger than width c1 of a heater upper part. Thus, the upper side heater 10 has a current-carrying cross-sectional area which is larger at the heater lower part than at the heater upper part, a resistance value which is accordingly smaller at the heater lower part than at the heater upper part, and a heat generation amount which becomes relatively smaller at the heater lower part than at the heater upper part.

Meanwhile, a lower side heater 20 is configured so that the width of the current passage is determined to have width c2 of a heater upper part larger than width c1 of a heater lower part. Thus, the lower side heater 20 has a current-carrying cross-sectional area which is larger at the heater upper part than at the heater lower part, a resistance value which is accordingly smaller at the heater upper part than at the heater lower part, and a heat generation amount which becomes relatively smaller at the heater upper part than at the heater lower part.

Figure 8:
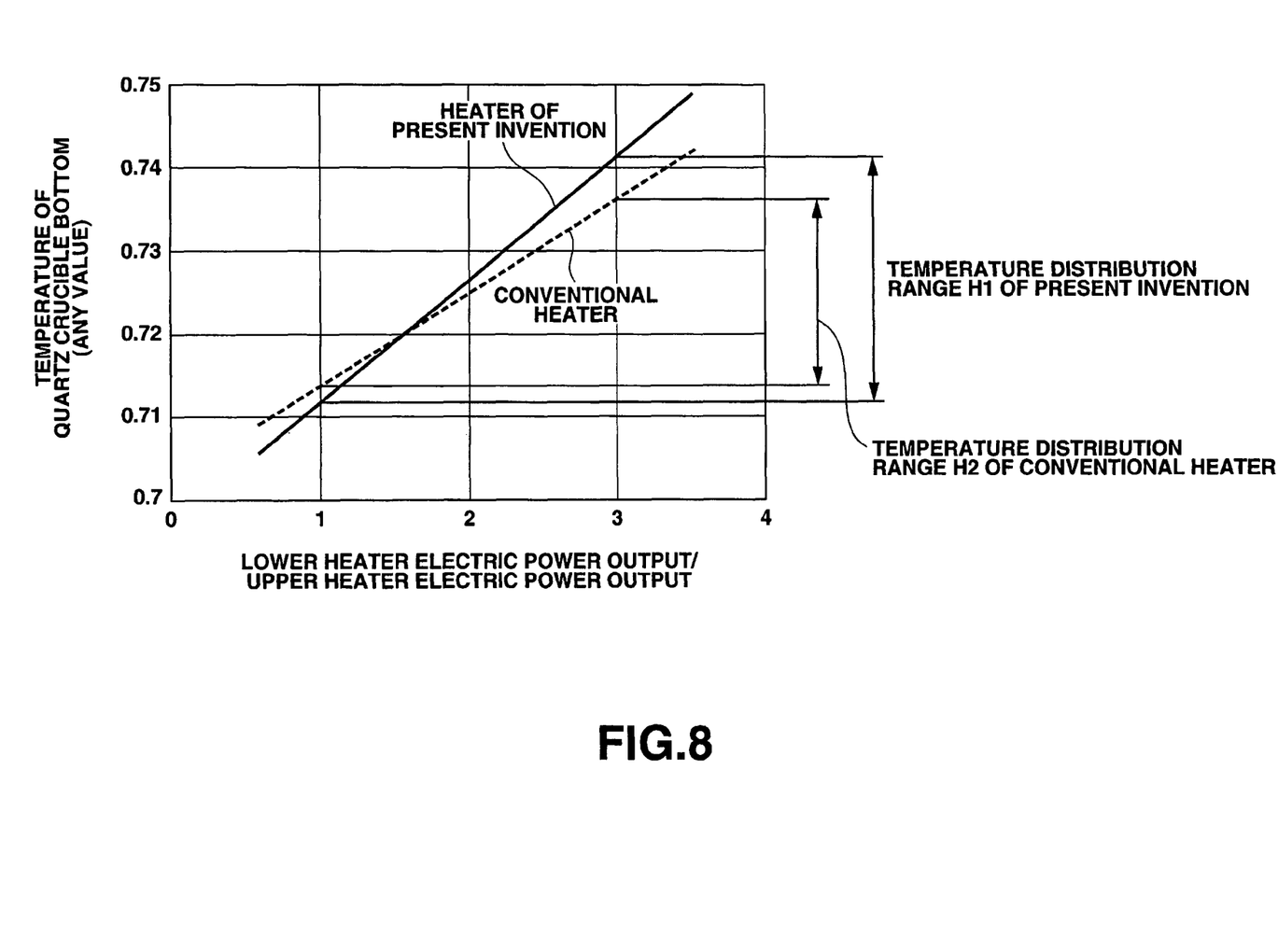
FIG. 8 is a comparison diagram of temperature distribution ranges of a quartz crucible bottom when the heaters of the present invention and a conventional heater are used.

As a result, it is seen as shown in FIG. 8 according to the present invention that when electric power is supplied at a prescribed electric power ratio (the ratio between approximately 1 and 3 in the figure) to the lower side heater 20 and the upper side heater 10, the temperature distribution range at the bottom of the quartz crucible 3 becomes larger than the prior art. Therefore, by adjusting the electric power ratio, the expansion of the temperature distribution at the respective positions in the vertical direction of the quartz crucible 3, namely at the respective positions in the growing direction of the single crystal silicon 6, is increased more than before, and the control width of the oxygen concentration in the single crystal silicon 6 is expanded more.

Figure 9A:
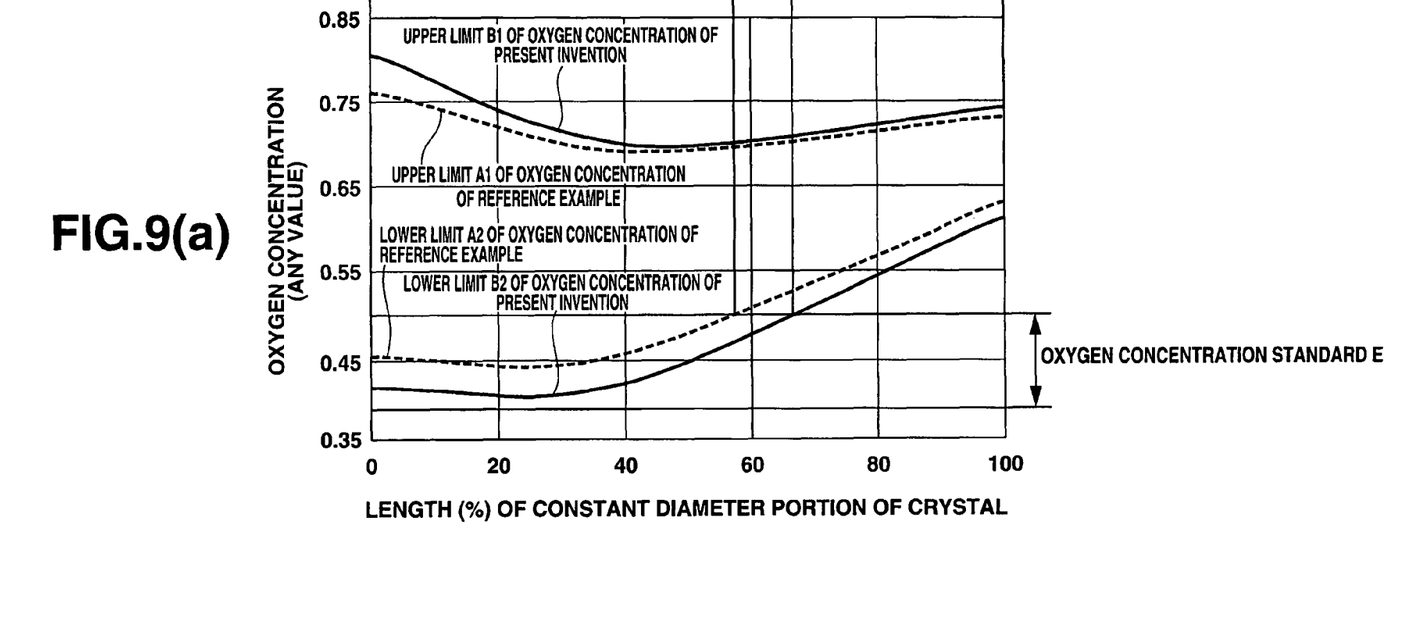
Figure 9B:
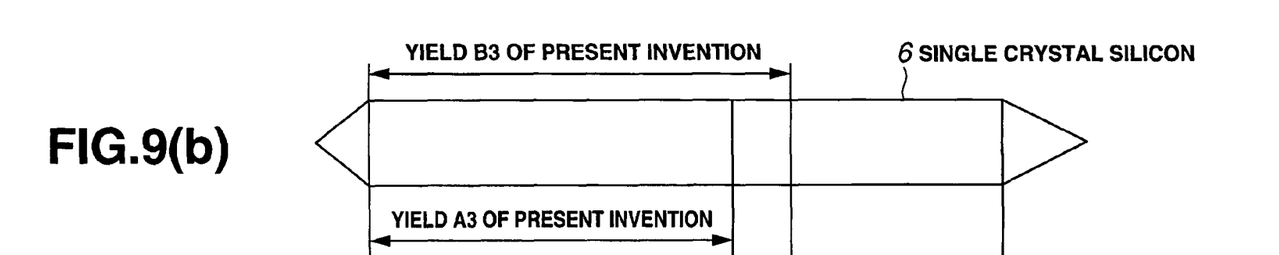
FIG. 9(b) is a diagram showing a length of a yield in a growing direction of a single crystal silicon in correspondence with FIG. 9(a).

As shown in FIG. 9(a), when the heaters of the present invention are used, an oxygen concentration control width B1-B2 of the single crystal silicon 6 is large, so that a length of a constant diameter portion of the crystal, which meets an oxygen concentration standard E, is increased. As a result, a range of the yield of the single crystal silicon 6 is increased when the heaters of the present invention are used as shown in FIG. 9(b).

Thus, the use of the heaters of the present invention for the single crystal silicon manufacturing apparatus provides an effect of improving the yield of the single crystal silicon 6 being pulled up.

For only the upper heater 10 according to the first invention and for only the lower heater 20 according to the second invention, the resistance value is adjusted to have a different heat generation amount between the heater upper part and the heater lower part. Referring to, for example, FIG. 5 according to the first invention, for only the upper side heater 10, the resistance value at the respective parts of the heater is adjusted so that the heat generation amount becomes relatively smaller at the heater lower part than at the heater upper part, and for the lower side heater 20, the resistance value is adjusted so that the heat generation amount becomes same between the heater upper part and the heater lower part similar to FIG. 4.

Figure 4:
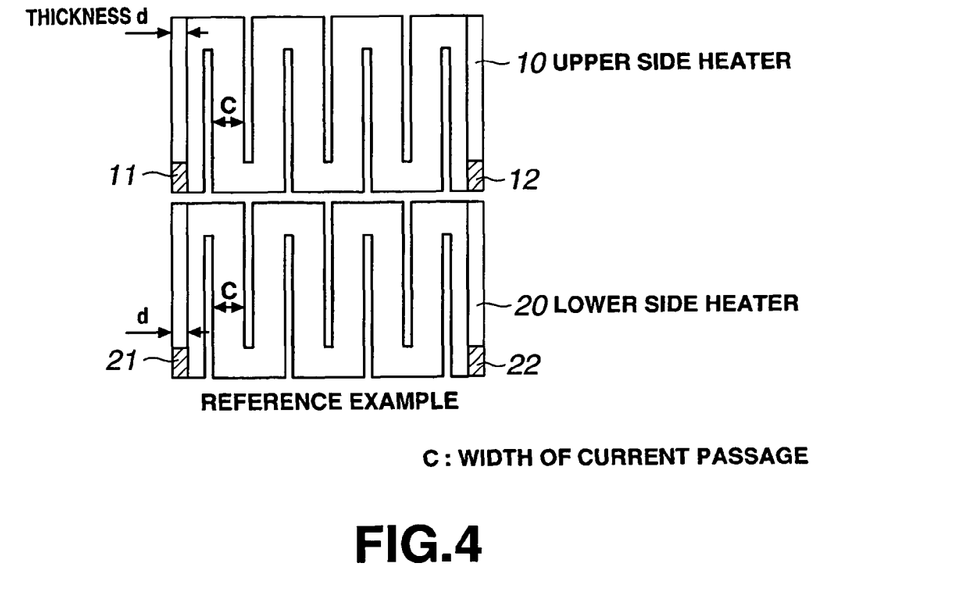
FIG. 4 is a sectional view showing a structure of heaters of a reference example.

For only the lower side heater 20 according to the second invention, the resistance value at the respective parts of the heater is adjusted so that the heat generation amount becomes relatively smaller at the heater upper part than at the heater lower part, and for the upper side heater 10, the resistance value is adjusted so that the heat generation amount becomes same between the heater upper part and the heater lower part similar to FIG. 4.

The heat generation amount at the respective parts of the heater is adjusted by adjusting the current-carrying cross-sectional areas of the heater (the fourth and fifth inventions).

As shown in FIG. 2 according to the sixth invention, the upper heater is configured to enter its current passage partly into a position lower than the position corresponding to the upper end position of the lower heater, and the lower heater is configured to enter its current passage partly into a position higher than the position corresponding to the lower end position of the upper heater.

Thus, the heat generation amount at the middle area of the heaters 10, 20 as a whole can be decreased in comparison with the heat generation amount at the upper areas of the heaters 10, as a whole and the heat generation amount at the lower area of the heaters 10, 20 as a whole.

The seventh to twelfth inventions are inventions of a method of manufacturing a single crystal semiconductor using the single crystal semiconductor manufacturing apparatuses of the first invention to the sixth invention.

BRIEF DESCRIPTION OF THE DRAWINGS

FIG. 9 (a) is a graph showing a relationship between a length of a constant diameter portion of a crystal and an oxygen concentration of a single crystal silicon.

EXPLANATION OF REFERENCE NUMERALS

10: Upper side heater
20: Lower side heater
30: Middle side heater

BEST MODE FOR CARRYING OUT THE INVENTION

Embodiments of a single crystal semiconductor manufacturing apparatus of the present invention and a heater used therefor will be described with reference to the figures.

Figure 1A:
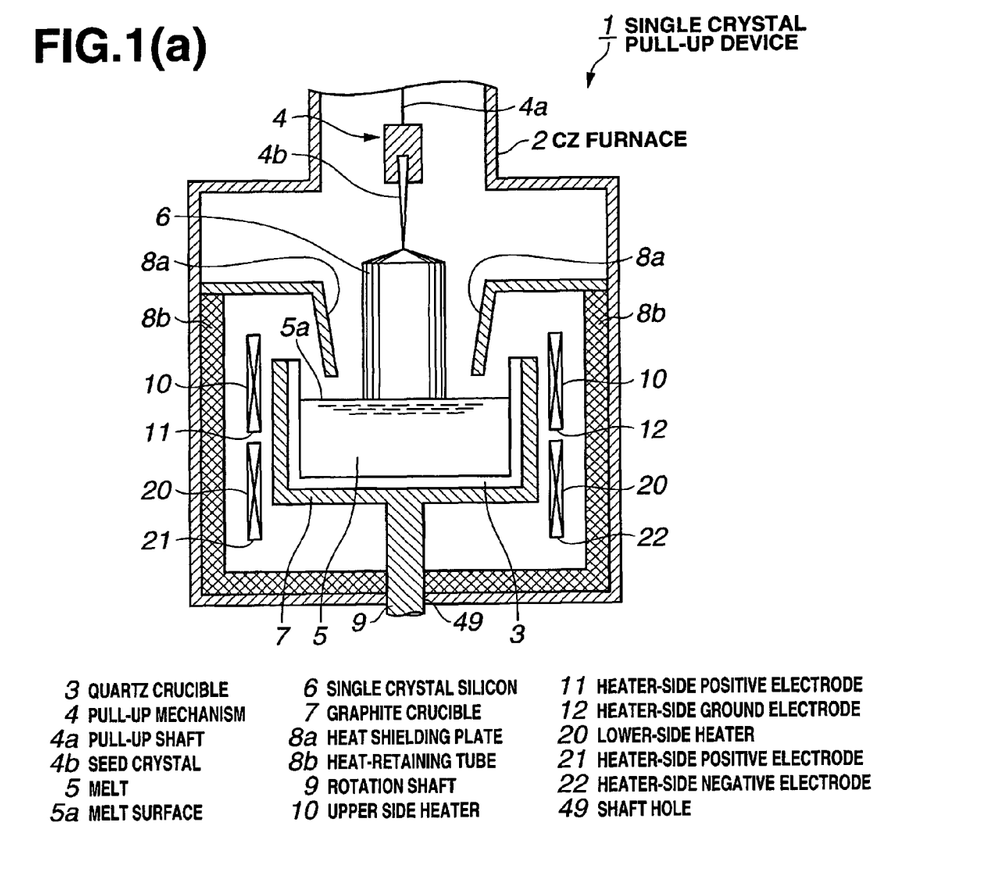
FIG. 1 is a sectional side view showing a structure of a single crystal semiconductor manufacturing apparatus in which heaters of an embodiment is incorporated.

FIG. 1(a) shows a sectional view of a side of a structure of a single crystal pull-up device 1 of an embodiment. Heaters of the embodiment are incorporated into the single crystal pull-up device 1.

As shown in FIG. 1, the single crystal pull-up device 1 of the embodiment is provided with a CZ furnace (chamber) 2 as a single crystal pulling vessel.

The CZ furnace 2 has therein a quartz crucible 3 in which a material for polycrystalline silicon is melted and stored as a melt 5. The quartz crucible 3 has its exterior covered with a graphite crucible 7. An upper side heater 10 and a lower side heater 20 are provided to surround the crucibles 3, 7 to heat and melt the polycrystalline silicon material in the quartz crucible 3. The upper side heater 10 and the lower side heater 20 are vertically arranged at upper and lower positions along the side surface of the quartz crucible 3.

Figure 1B:
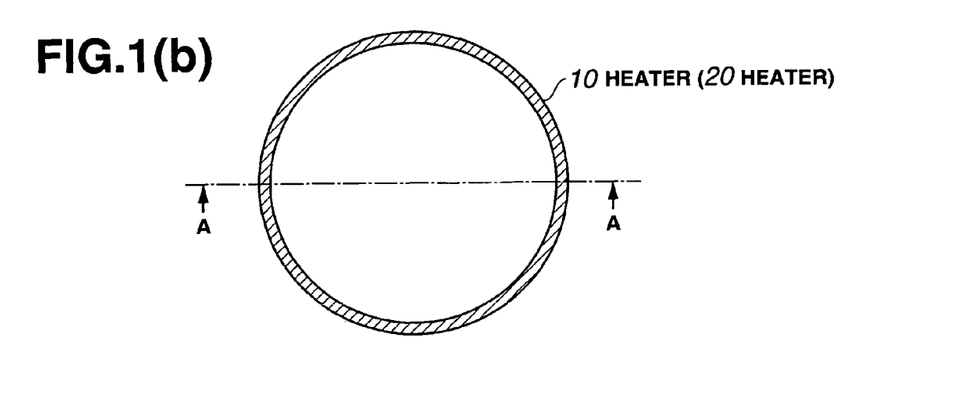

FIG. 1(b) is a diagram of the upper side heater 10 and the lower side heater 20 viewed from above, and the upper side heater 10 and the lower side heater 20 are formed to have a circular shape around the outer circumferential surface of the quartz crucible 3.

It is not shown in FIG. 1, but a ring-shaped bottom heater may be provided below the lower side heater 20 and under the bottom surfaces of the crucibles 3, 7.

FIG. 2 is a sectional view (A-A sectional view) of the upper side heaters 10, 20 taken along line A-A of FIG. 1(b), showing a structure of the heaters of Example 1.

The upper side heater 10 and the lower side heater 20 are separately supplied with electric power and configured of a conductor which generates heat when electric power is applied. In other words, separate power sources are provided for the individual heaters 10, 20 and provided with positive electrodes 11, 21 and negative (ground) electrodes 12, 22 for the individual heaters 10, 20. Voltages applied to the individual heaters 10, 20 are separately adjusted to independently adjust heat generation amounts, namely heating amounts to the quartz crucible 3.

Application of voltage from the power source for the upper side heater 10 between the positive electrode 11 and the negative electrode 12 of the heater 10 flows electric current to the upper side heater 10 to generate heat. Voltage of the power source for the upper side heater 10 is varied to adjust the heat generation amount of the upper side heater 10 and to control the heating amount of an upper side of the quartz crucible 3.

Application of voltage from the power source for the lower side heater 20 between the positive electrode 21 and the negative electrode 22 of the heater 20 flows electric current to the lower side heater 20 to generate heat. Voltage of the power source for the lower side heater 20 is varied to adjust the heat generation amount of the lower side heater 20 and to control the heating amount of a lower side of the quartz crucible 3.

For example, the upper side heater 10 and the lower side heater 20 are configured of graphite (carbon). A material for the heaters 10, 20 may be any type other than graphite if it is conductive, generates heat when electric power is applied, and does not become a pollutant source. For example, it may be a C/C composite (carbon fiber reinforced carbon composite material).

A heat-retaining tube 8b which is made of a heat insulating material is provided between the upper side and lower side heaters 10, 20 and the inner wall of the CZ furnace 2.

A pull-up mechanism 4 is provided above the quartz crucible 3. The pull-up mechanism 4 includes a pull-up shaft 4a and a seed crystal 4b.

When the melting in the quartz crucible 3 is stabilized, the pull-up shaft 4a is moved in a vertical direction to immerse the seed crystal 4b into the melt 5, and a single crystal silicon ingot 6 is pulled up from the melt 5 by a CZ method. When pulling up, the quartz crucible 3 is rotated by a rotation shaft 9. A shaft hole 49 through which the rotation shaft 9 is inserted is formed in the bottom of the CZ furnace 2.

The interior of the CZ furnace 2 is maintained vacuum (e.g., about 20 Torr) by shielding from outside air. Namely, argon gas is supplied as an inert gas into the CZ furnace 2 and pumped out through an exhaust opening of the CZ furnace 2. Thus, the interior of the furnace 2 is decompressed to a prescribed pressure.

During the single crystal pull-up process (single batch), various types of vaporized materials are produced in the CZ furnace. Therefore, the CZ furnace 2 is cleaned by supplying the argon gas into the CZ furnace 2 and discharging it together with the vaporized materials out of the CZ furnace 2 to remove the vaporized materials from the interior of the CZ furnace 2. A supply flow rate of the argon gas is determined for each step in the single batch.

A heat shielding plate 8a (gas rectifying tube) is disposed above the quartz crucible 3 and around the single crystal silicon 6. The heat shielding plate 8a is supported by the heat-retaining tube 8b. The heat shielding plate 8a guides the argon gas, which is supplied as a carrier gas into the CZ furnace 2 from above, to the center of a melt surface 5a, allows to pass along the melt surface 5a and guides to the peripheral portion of the melt surface 5a. The argon gas 7 is discharged together with the gas evaporated from the melt 5 through an exhaust port formed at a lower part of the CZ furnace 2. Therefore, oxygen evaporated from the melt 5 can be kept in a stable state, and a gas flow rate on the melt surface can be stabilized.

The heat shielding plate 8a insulates and shields the single crystal silicon 6 from radiant heat generated from the heat sources such, as the quartz crucible 3, the melt 5 and the heaters 10, 20. And, the heat shielding plate 8a prevents that the impurity (e.g., silicon oxide) and the like generated within the furnace adhere to the single crystal silicon 6 to impair the growth of the single crystal. The gap between the bottom end of the heat shielding plate 8a and the melt surface 5a can be adjusted by vertically moving the rotating shaft 9 to change the vertical position of the crucible 3.

By changing the vertical position of the quartz crucible 3, the vertical positional relation between the crucible 3 and the upper and lower heaters 10, 20 is also changed relatively.

FIG. 4 shows a structure of the heaters of a reference example. The heaters of Example 1 shown in FIG. 2 and the heaters of the reference example shown in FIG. 4 are described in comparison with each other.

In the reference example shown in FIG. 4, width c and thickness d of the current passage of the upper side heater 10 are equal at each part of the heater, and a heat generation amount is not different between the heater upper part and the heater lower part. Similarly, width c and thickness d of the current passage of the lower side heater 20 are equal at each part of the heater, and the heat generation amount is not different between the heater upper part and the heater lower part.

Meanwhile, the upper side heater 10 of the heaters of Example 1 as shown in FIG. 2 is configured so that the width of the current passage is determined to have width c2 of a heater lower part larger than width c1 of a heater upper part. Thus, the upper side heater 10 has a current-carrying cross-sectional area which is larger at the heater lower part than at the heater upper part, a resistance value which is accordingly smaller at the heater lower part than at the heater upper part, and a heat generation amount which becomes relatively smaller at the heater lower part than at the heater upper part.

The lower side heater 20 is configured so that the width of the current passage is determined to have width c2 of a heater upper part larger than width c1 of a heater lower part. Thus, the lower side heater 20 has a current-carrying cross-sectional area which is larger at the heater upper part than at the heater lower part, a resistance value becomes accordingly smaller at the heater upper part than at the heater lower part, and a heat generation amount becomes relatively smaller at the heater upper part than at the heater lower part.

The upper side heater 10 of Example 1 shown in FIG. 2 is configured to enter its current passage partly into a position lower than the position corresponding to the upper end position of the lower side heater 20 of the reference example shown in FIG. 4, and the lower side heater 20 of Example 1 shown in FIG. 2 is configured to enter its current passage partly into a position higher than the position corresponding to the lower end position of the upper side heater 10 of the reference example shown in FIG. 4. Thus, when the heaters 10, 20 of Example 1 shown in FIG. 4 are viewed as a whole, the heat generation amount of the middle region of the heaters 10, 20 as a whole becomes small in comparison with the heat generation amount of the upper region of the heaters 10, 20 as a whole and the heat generation amount of the lower region of the heaters 10, 20 as a whole.

It is desirable that heat generating portion height X of a main heat generating portion of each of the upper side heater 10 and the lower side heater 20 is determined to be 1/2.5 times or less with respect to height Y of the entire heater.

The upper side heater 10 is desired that a current-carrying cross-sectional area ratio of the heater lower part to the heater upper part is 1.5 times or more to make the heat generation amount of the heater lower part smaller than the heater upper part. Similarly, the lower side heater 20 is desired that a current-carrying cross-sectional area ratio of the heater upper part to the heater lower part is 1.5 times or more to make the heat generation amount of the heater upper part smaller than the heater lower part. For example, the width c1 of the heater and the width c2 of the heater are desired to meet a relation of $c2 \geq 1.5 \times c1$.

To configure the heaters of Example 1 shown in FIG. 2, the number of slits is not limited but may be determined in accordance with a desired heater resistance value.

For example, it is desired that an interval (slit width a) of the current passage configuring the heater is determined to be about 5 to 30 mm, and an interval b between the upper heater 10 and the lower heater 20 is determined to be about 10 to 30 mm. When the intervals a, b are increased, heat escapes through the gap in a large amount, and it becomes hard to obtain the effects of the present invention, and when the intervals a, b are decreased conversely, a possibility of electric discharge is increased, and the process itself might not be established.

FIG. 8 is a diagram comparing temperature distribution ranges of quartz crucible bottoms when the heaters of the present invention and the conventional heaters are used.

In FIG. 8, the heaters of the present invention are the upper and lower heaters 10, 20 of FIG. 2, and the conventional heaters are the upper and lower heaters 10, 20 of FIG. 4.

In the figure, the horizontal axis represents an electric power ratio (between approximately 1 and 3 in the figure) obtained by dividing an electric power output of the lower heater by an electric power output of the upper heater, indicating that when the electric power ratio is larger, the output of the lower heater 20 becomes larger than that of the upper heater. The vertical axis represents the temperatures of the center portion of the bottom of the quartz crucible 3 by any value. There are also shown a temperature distribution range H1 of the present invention and a conventional temperature distribution range H2 when the electric power ratio is between 1 and 3.

It is seen from FIG. 8 that the temperature distribution range of the bottom of the quartz crucible 3 according to the present invention is larger than the conventional one. Therefore, by adjusting the electric power ratio, the expansion of the temperature distribution at the individual positions in the vertical direction of the quartz crucible 3, namely, at the individual positions in the growing direction of the single crystal silicon 6 is made larger in comparison with the reference example, and the control width of the oxygen concentration of the single crystal silicon 6 is made larger.

FIG. 9(a) shows a graph of the control width of the oxygen concentration in the single crystal silicon 6, and FIG. 9(b) shows a yield range of the single crystal silicon 6 (ingot) in the growing direction in correspondence with FIG. 9(a). The horizontal axis of FIG. 9(a) represents a length (%) of a constant diameter portion of a crystal, and the vertical axis represents an oxygen concentration (any value) of the single crystal silicon 6.

In FIG. 9(a), the oxygen concentration in the single crystal silicon 6 when the heaters of the reference example are used is indicated by a broken line, and the oxygen concentration in the single crystal silicon 6 when the heaters of the present invention (Example 1) are used is indicated by a solid line.

As shown in FIG. 9(a), when the heaters of the reference example are used, the upper limit value of the oxygen concentration in the single crystal silicon 6 is A1 and the lower limit value is A2. And, the width between the upper limit value A1 and the lower limit value A2 indicates the oxygen concentration control width of the single crystal silicon 6 when the heaters of the reference example are used.

Meanwhile, when the heaters of the present invention (Example 1) are used, the upper limit value of the oxygen concentration in the single crystal silicon 6 is B1 and the lower limit value is B2. And, the width between the upper limit value B1 and the lower limit value B2 indicates the oxygen concentration control width of the single crystal silicon 6 when the heaters of the present invention (Example 1) are used.

It is seen that when the heaters of the present invention (Example 1) are used, the oxygen concentration control width B1-B2 of the single crystal silicon 6 is larger than the oxygen concentration control width A1-A2 of the single crystal silicon 6 when the heaters of the reference example are used.

In FIG. 9(a), E represents an oxygen concentration standard. Conformity of the oxygen concentration with the oxygen concentration standard E is a condition for the yield of the single crystal silicon 6.

When the heaters of the present invention (Example 1) are used, the oxygen concentration control widths B1 and B2 of the single crystal silicon 6 are large, so that a length of a constant diameter portion of a crystal which meets the oxygen concentration standard E is increased in comparison with the case of using the heaters of the reference example. As a result, a range of the yield of the single crystal silicon 6 when the heaters of the present invention (Example 1) are used is increased in comparison with that of the single crystal silicon 6 when the heaters of the reference example are used as shown in FIG. 9(b).

Thus, when the heaters of the present invention (Example 1) are used for the single crystal silicon manufacturing apparatus, there is provided an effect of increasing the yield of the single crystal silicon 6 to be pulled up.

Figure 5:
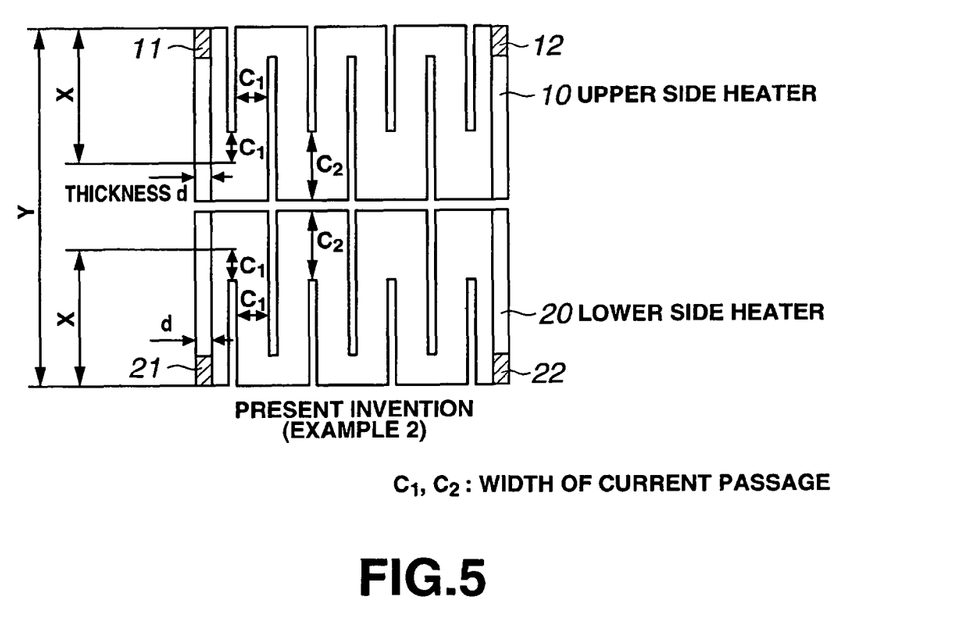
FIG. 5 is a sectional view showing a structure of heaters of Example 2.
Figure 6:
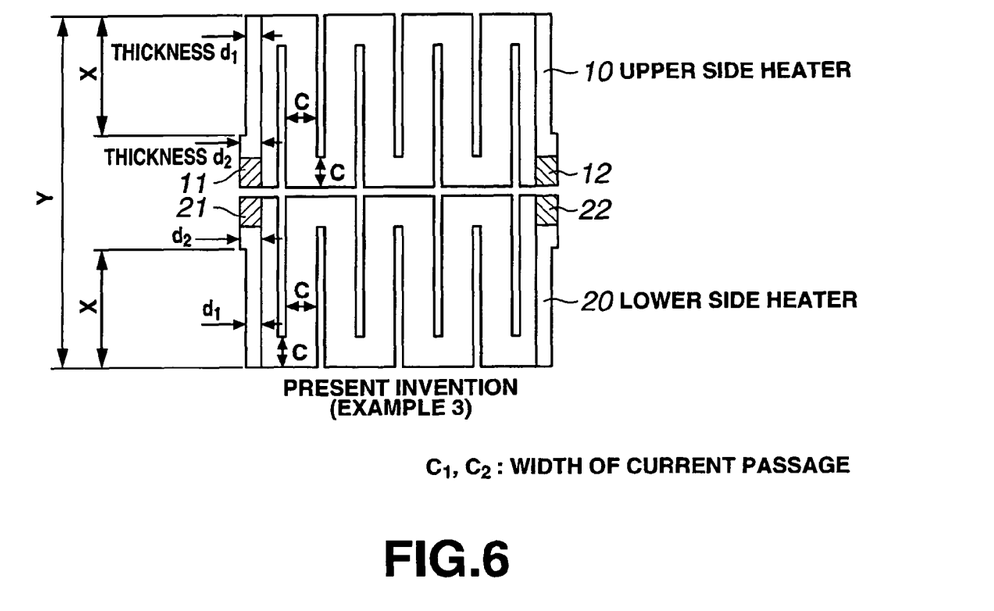
FIG. 6 is a sectional view showing a structure of heaters of Example 3.
Figure 7:
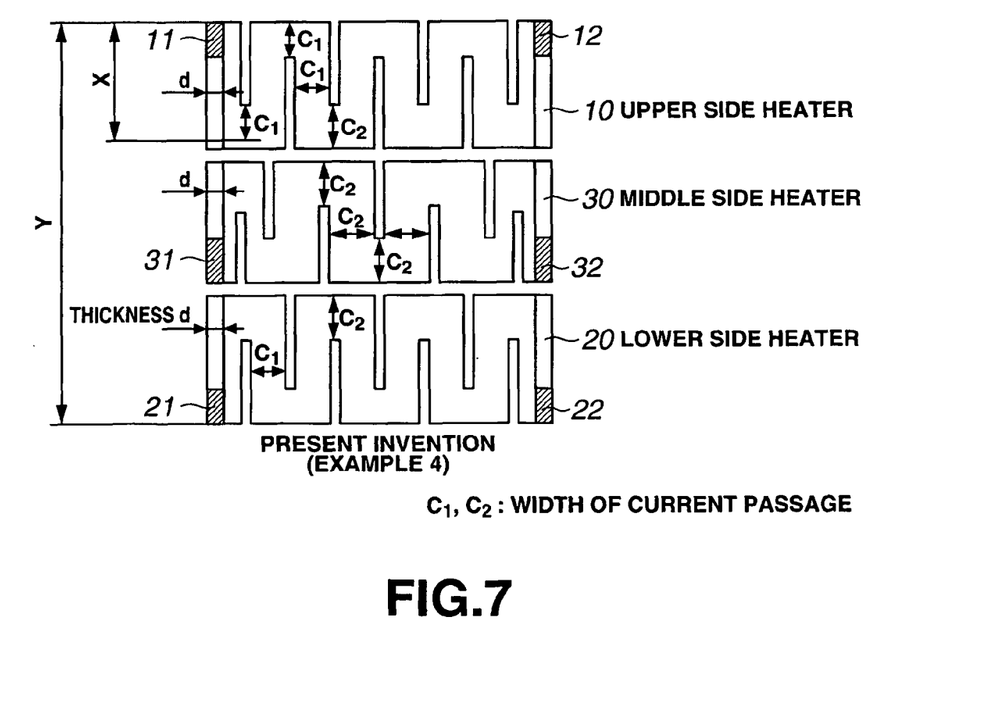
FIG. 7 is a sectional view showing a structure of heaters of Example 4.

The above-described structure of the heaters of Example 1 shown in FIG. 2 is merely one example, and the heaters configured as shown in FIG. 5, FIG. 6 and FIG. 7 are also applicable.

FIG. 5 shows a structure of the heaters of Example 2.

The heaters of Example 2 are configured in the same manner as the heaters of Example 1 of FIG. 2 except that the lower end position of the upper side heater 10 and the upper end position of the lower side heater 20 are at the same position as the lower end position of the upper side heater 10 and the upper end position of the lower side heater 20 of the reference example shown in FIG. 4.

Namely, the current passage width of the upper side heater 10 is determined such that a width c2 of the heater lower part is larger than a width c1 of the heater upper part. Thus, the upper side heater 10 has a current-carrying cross-sectional area which is larger at the heater lower part than at the heater upper part, a resistance value which is accordingly smaller at the heater lower part than at the heater upper part, and a heat generation amount which becomes relatively smaller at the heater lower part than at the heater upper part.

Meanwhile, the lower side heater 20 is configured so that the width of the current passage is determined to have a width c2 of the heater upper part larger than a width c1 of the heater lower part. Thus, the lower side heater 20 has a current-carrying cross-sectional area which is larger at the heater upper part than at the heater lower part, a resistance value which is accordingly smaller at the heater upper part than at the heater lower part, and a heat generation amount which becomes relatively smaller at the heater upper part than at the heater lower part.

It is desirable that heat generating portion height X of a main heat generating portion of each of the upper side heater 10 and the lower side heater 20 is determined to be 1/2.5 times or less with respect to height Y of the entire heater.

And, the upper side heater 10 is desired that a current-carrying cross-sectional area ratio of the heater lower part to the heater upper part is 1.5 times or more to make the heat generation amount of the heater lower part smaller than the heater upper part. Similarly, the lower side heater 20 is desired that a current-carrying cross-sectional area ratio of the heater upper part to the heater lower part is 1.5 times or more to make the heat generation amount of the heater upper part smaller than the heater lower part. For example, the width c1 of the heater and the width c2 of the heater are desired to meet a relation of $c2 \geq 1.5 \times c1$.

When the heaters of Example 2 are used and the electric power ratio operation range is determined constant similar to the case that the heaters of Example 1 of FIG. 8 are used, the temperature distribution range of the bottom of the quartz crucible 3 is increased in comparison with the conventional one. Therefore, similar to the case that the heaters of Example 1 are used, the oxygen concentration widths B1 and B2 of the single crystal silicon 6 are increased (FIG. 9(a)). As a result, the yield of the single crystal silicon 6 is improved (FIG. 9(b)).

FIG. 6 shows a structure of the heaters of Example 3.

Similar to the above-described heaters of Example 2 of FIG. 5, the heaters of Example 3 have the lower end position of the upper side heater 10 and the upper end position of the lower side heater 20 at the same position as the lower end position of the upper side heater 10 and the upper end position of the lower side heater 20 of the reference example shown in FIG. 4.

But, different from the heaters of the Example 2 of FIG. 5, a heat generation amount is changed by changing not the current passage width c but the current passage thickness d.

Namely, the upper side heater 10 is configured so that the current passage thickness is determined to have thickness d2 of the heater lower part larger than thickness d1 of the heater upper part. Thus, the upper side heater 10 has a current-carrying cross-sectional area which is larger at the heater lower part than at the heater upper part, a resistance value which becomes accordingly smaller at the heater lower part than at the heater upper part, and a heat generation amount which becomes relatively smaller at the heater lower part than at the heater upper part.

Meanwhile, the lower side heater 20 is configured so that the current passage thickness is determined to have thickness d2 of the heater upper part larger than thickness d1 of the heater lower part. Thus, the lower side heater 20 has a current-carrying cross-sectional area which is larger at the heater upper part than at the heater lower part, a resistance value which becomes accordingly smaller at the heater upper part than at the heater lower part, and a heat generation amount which becomes relatively smaller at the heater upper part than at the heater lower part.

It is desirable that heat generating portion height X of the main heat generating portion of each of the upper side heater 10 and the lower side heater 20 is determined to be 1/2.5 times or less with respect to height Y of the entire heater.

And, the upper side heater 10 is desired that a current-carrying cross-sectional area ratio of the heater lower part to the heater upper part is 1.5 times or more to make the heat generation amount of the heater lower part smaller than the heater upper part. Similarly, the lower side heater 20 is desired that a current-carrying cross-sectional area ratio of the heater upper part to the heater lower part is 1.5 times or more to make the heat generation amount of the heater upper part smaller than the heater lower part. For example, the width c1 of the heater and the width c2 of the heater are desired to meet a relation of $d2 \geq 1.5 \times d1$.

When the heaters of Example 3 are used and the electric power ratio operation range is determined constant similar to the case that the heaters of Example 1 of FIG. 8 are used, the temperature distribution range of the bottom of the quartz crucible 3 is increased in comparison with the conventional one. Therefore, similar to the case that the heaters of Example 1 are used, the oxygen concentration widths B1 and B2 of the single crystal silicon 6 are increased (FIG. 9(a)). As a result, the yield of the single crystal silicon 6 is improved (FIG. 9(b)).

FIG. 7 shows a structure of the heaters of Example 4.

The heaters of Example 4 are different from those of Example 1, Example 2 and Example 3 and configured of not vertically disposed two heaters but vertically disposed three heaters.

Namely, an upper side heater 10, a middle side heater 30 and a lower side heater 20 are vertically disposed in series from above at individual positions of the quartz crucible 3.

The upper side heater 10 is configured so that the current passage width is determined to have width c2 of the heater lower part larger than width c1 of the heater upper part. Thus, the upper side heater 10 has a current-carrying cross-sectional area which is larger at the heater lower part than at the heater upper part, a resistance value which becomes accordingly smaller at the heater lower part than at the heater upper part, and a heat generation amount which becomes relatively smaller at the heater lower part than at the heater upper part.

The lower side heater 20 is configured so that the current passage width is determined to have width c2 of the heater upper part larger than width c1 of the heater lower part. Thus, the lower side heater 20 has a current-carrying cross-sectional area which is larger at the heater upper part than at the heater lower part, a resistance value which becomes accordingly smaller at the heater upper part than at the heater lower part, and a heat generation amount which becomes relatively smaller at the heater upper part than at the heater lower part.

Meanwhile, the middle side heater 30 is configured so that the current passage width is determined to be equal to the width c2 of the individual parts of the heater. The current passage width of the middle side heater 30 is made equal to the maximum width (c2) of the current passages of the upper side heater 10 and the lower side heater 20 so that the middle side heater 30 has a heat generation amount which is smaller than the upper part of the upper side heater 10 and the lower part of the lower side heater 20, but the width may be further increased to a larger size to further decrease the heat generation amount.

In addition to the setting of the current-carrying cross-sectional area of the heaters, it is desirable that electric power supplied to the middle side heater 30 is determined to be 33% or less of the total power of all the three-staged heaters. Thus, the heater upper part of the upper side heater 10 and the heater lower part of the lower side heater 20 can be made to have a heat generation amount which is relatively larger in comparison with the heat generation amount of the other heater portion.

It is preferable that heat generating portion height X of the main heat generating portion of each of the upper side heater 10 and the lower side heater 20 is determined to be 1/2.5 times or less with respect to height Y of the entire heater.

The upper side heater 10 is desired that a current-carrying cross-sectional area ratio of the heater lower part to the heater upper part is 1.5 times or more to make the heat generation amount of the heater lower part smaller than the heater upper part. Similarly, the lower side heater 20 is desired that a current-carrying cross-sectional area ratio of the heater upper part to the heater lower part is 1.5 times or more to make the heat generation amount of the heater upper part smaller than the heater lower part. For example, the width c1 of the heater and the width c2 of the heater are desired to meet a relation of $c2 \geq 1.5 \times c1$.

In Example 4 of FIG. 7, the width c of the current passages at the individual parts of the heater is changed to change the heat generation amount of the individual parts of the heater, but similar to FIG. 6, the thickness d of the current passages at the individual parts of the heater may be changed to change the heat generation amount at the individual parts of the heater.

When the heaters of Example 4 are used and the electric power ratio operation range is determined constant similar to the case that the heaters of Example 1 of FIG. 8 are used, the temperature distribution range of the bottom of the quartz crucible 3 is increased in comparison with the conventional one. Therefore, the heat generation area of the upper side heater 10 and the heat generation area of the lower side heater 20 have a clearly separating temperature distribution, and similar to the case that the heaters of Example 1 are used, the oxygen concentration widths B1 and B2 of the single crystal silicon 6 are increased (FIG. 9(a)). As a result, the yield of the single crystal silicon 6 is improved (FIG. 9(b)).

In the above-described example, for the upper heater 10, the resistance value at the respective parts of the heater is adjusted so that the heater lower part becomes to have relatively a smaller heat generation amount than the heater upper part, and for the lower heater 20, the resistance value at the respective parts of the heater is adjusted so that the heater upper part becomes to have relatively a smaller heat generation amount than the heater lower part. But the present invention can also adjust the resistance value to have a different heat generation amount between the heater upper part and the lower part for only the upper heater 10 or for only the lower heater 20. For example, in Example 2 shown in FIG. 5, for only the upper side heater 10, the resistance value at the respective parts of the heater can be adjusted (e.g., to make the current passage widths c1, c2 different) so that the heat generation amount becomes relatively smaller at the heater lower part than at the heater upper part, and for the lower side heater 20, the heat generation amount can be determined same (e.g., to make it same as the current passage width c) between the heater upper part and the lower part similar to the reference example of FIG. 4.

Conversely, for only the lower side heater 20, the resistance value at the respective parts of the heater can be adjusted so that the heat generation amount becomes relatively smaller at the heater upper part than at the heater lower part, and for the upper side heater 10, the heat generation amount can be also determined same between the heater upper part and the heater lower part similar to the reference example of FIG. 4.

Example 4 has the vertically disposed three heaters, but the heaters may be disposed vertically in four or more stages at the respective positions of the quartz crucible 3. In such a case, the heater at the top stage has, for example, the resistance values at the respective parts of the heater adjusted so that the heat generation amount becomes relatively smaller at the heater lower part than at the heater upper part, and the heater at the bottom stage has the resistance values at the respective parts of the heater adjusted so that the heat generation amount becomes relatively smaller at the heater upper part than at the heater lower part. Others can also be performed according to Example 4, so that the description thereof is omitted.

Industrial Applicability

The present invention is not limited to the silicon single crystal only but can also be applied to an apparatus for manufacturing a compound semiconductor such as gallium arsenide.

The invention claimed is:

1. A single crystal semiconductor manufacturing apparatus, provided with a chamber having therein a crucible in which material for a single crystal semiconductor is melted and upper and lower heaters which are provided around the crucible and heat the material in the crucible, and a pull-up mechanism which immerses a seed crystal into the melted material and pulls up a single crystal, wherein:
 each of the upper and lower heaters having an upper level and a lower level disposed about a horizontal center line of each said heater, said heaters being disposed about the crucible;
 said upper level and said lower level of each said heater being asymmetric about said horizontal center line to each other in each of said upper and lower heaters
 the upper level of the upper heater having a larger current-carrying area than the lower level of the upper heaters and a smaller electric resistance in the lower level of the upper heaters than the upper level of the upper heaters; and
 the upper level of the lower heater having less heat generation than the lower level of the lower heater.

2. The single crystal semiconductor manufacturing apparatus according to claim 1, wherein the current-carrying areas of the upper level and the lower level of the individual heaters are adjusted depending on a current passage width or a current passage thickness.

3. The single crystal semiconductor manufacturing apparatus according to claim 1 or 2, wherein the upper heater is formed to enter its current passage partly into a position lower than the position corresponding to the upper end position of the lower heater; and the lower heater is formed to enter its current passage partly into a position higher than the position corresponding to the lower end position of the upper heater.

4. A single crystal semiconductor manufacturing method using a single crystal semiconductor manufacturing apparatus, provided with a chamber having therein a crucible in which material for a single crystal semiconductor is melted and heaters which are provided around the crucible and heat the material in the crucible, and a pull-up mechanism which immerses a seed crystal into the melted material and pulls up a single crystal, the steps including:
 upper heaters and lower heaters disposed about the crucible each heater having an upper level and a lower level;
 forming each said upper level of each upper heater to be asymmetric to each lower level of the upper heater with an electrical resistance value with to a different heat generation amount than a lower level of the upper heater; and
 thereby manufacture a single crystal semiconductor.

5. The single crystal semiconductor manufacturing method according to claim 4, wherein the areas of the upper and lower levels of the individual heaters are adjusted depending on a current passage width or a current passage thickness.

6. The single crystal semiconductor manufacturing method according to claim 4 or 5, wherein an upper heater is formed to enter a current passage partly into a position lower than a second position corresponding to an upper end position of a lower heater; and the lower heater is formed to enter its current passage partly into a position higher than the position corresponding to the lower end position of the upper heater.

* * * * *